(12) United States Patent
Choi (10) Patent No.: US 7,202,688 B2
(45) Date of Patent: Apr. 10, 2007

(54) OUTPUT BUFFER CIRCUIT HAVING SIGNAL PATH USED FOR TESTING AND INTEGRATED CIRCUIT AND TEST METHOD INCLUDING THE SAME

(75) Inventor: Si-Young Choi, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/851,332

(22) Filed: May 24, 2004

(65) Prior Publication Data

US 2004/0239358 A1    Dec. 2, 2004

(30) Foreign Application Priority Data

May 26, 2003    (KR)    ............ 10-2003-0033349

(51) Int. Cl.
*G01R 31/02*    (2006.01)
(52) U.S. Cl. .................................. 324/763
(58) Field of Classification Search ............... 324/73.1, 324/763, 765, 158.1; 714/724, 733, 734
See application file for complete search history.

(56) References Cited

U.S. PATENT DOCUMENTS

| | | | | |
|---|---|---|---|---|
| 4,357,703 A | * | 11/1982 | Van Brunt | ............... 714/733 |
| 4,931,722 A | * | 6/1990 | Stoica | ................... 714/733 |
| 5,046,048 A | * | 9/1991 | Atsumi et al. | ............ 365/201 |
| 5,377,144 A | * | 12/1994 | Brown | ................. 365/189.02 |
| 5,381,372 A | * | 1/1995 | Kozuka et al. | ............. 365/201 |
| 6,286,120 B1 | | 9/2001 | Reichert et al. | |
| 6,469,534 B1 | * | 10/2002 | Kimura | ..................... 324/763 |
| 6,539,511 B1 | * | 3/2003 | Hashizume | ................. 714/727 |
| 2002/0184583 A1 | * | 12/2002 | Hikone et al. | ............. 714/726 |

FOREIGN PATENT DOCUMENTS

| | | |
|---|---|---|
| KR | 1993-0003179 | 3/1992 |
| KR | 10-0228371 | 11/1999 |

\* cited by examiner

*Primary Examiner*—Jermele Hollington
(74) *Attorney, Agent, or Firm*—Volentine & Whitt, P.L.L.C.

(57) ABSTRACT

An output buffer circuit includes a signal path used for testing and designed for outputting output signals at predetermined logic levels in response to internal output signals from an internal logic circuit. The output buffer circuit and includes a first control input, a second control input, a test signal input circuit, and a plurality of output buffers. The first control input receives a predetermined control signal. The second control input receives a test signal having a predetermined voltage. The test signal input circuit switches between a test mode and a normal mode in response to the control signal, receives and outputs the test signal while in the test mode, and receives and outputs the internal output signals while in the normal mode. The plurality of output buffers output the output signals through a plurality of outputs, in response to the internal output signals or the test signal. The output buffer circuit, and a test method using the same, are advantageous in that the characteristics of the output buffers can be exactly evaluated without being affected by the internal logic circuit.

9 Claims, 6 Drawing Sheets

OUTPUT BUFFER CIRCUIT HAVING SIGNAL PATH USED FOR TESTING AND INTEGRATED CIRCUIT AND TEST METHOD INCLUDING THE SAME

CROSS REFERENCES TO RELATED APPLICATION

This application claims the priority of Korean Patent Application No. 2003-33349, filed on May 26, 2003, in the Korean Intellectual Property Office, the disclosure of which is hereby incorporated herein by reference in its entirety for all purposes as if fully set forth herein.

BACKGROUND AND SUMMARY

1. Technical Field

The present invention relates to an output buffer circuit, and more particularly, to an output buffer circuit having a signal path used for testing and a test method of the same.

2. Description

In general, before shipping goods related to a semiconductor device, a performance test is implemented on the semiconductor device to check whether or not defects have occurred during the manufacturing process. A procedure of evaluating the characteristic of output buffers is included in the performance test of the semiconductor device. During the procedure of evaluating the characteristics of the output buffers, it is checked whether or not the output signals VOH or VOL, which are output from the output buffers, have voltage levels within a predetermined range. Here, the output signals VOH have a "high" voltage level, and the output signals VOL have a "low" voltage level.

Meantime, the voltage level ranges of the output signals VOH or VOL are determined by the current drive capability of the output buffers of the semiconductor device. In further detail, even though two output buffers output signals VOH having a "high" voltage level, the voltage levels are different between signals VOH output from an output buffer having a current drive capability of 2 mA and signals VOH output from an output buffer having a current drive capability of 1 mA. Thus, the output buffers of the semiconductor device output signals VOH or VOL having different voltage levels depending on their current drive capability.

In the conventional art, automatic test equipment (ATE) has been used to evaluate the characteristics of output buffers of a semiconductor device. One example of ATE is disclosed in U.S. Pat. No. 6,286,120. An explanation of the ATE disclosed in U.S. Pat. No. 6,286,120 will be made below with reference to FIG. 1.

Figure 1:
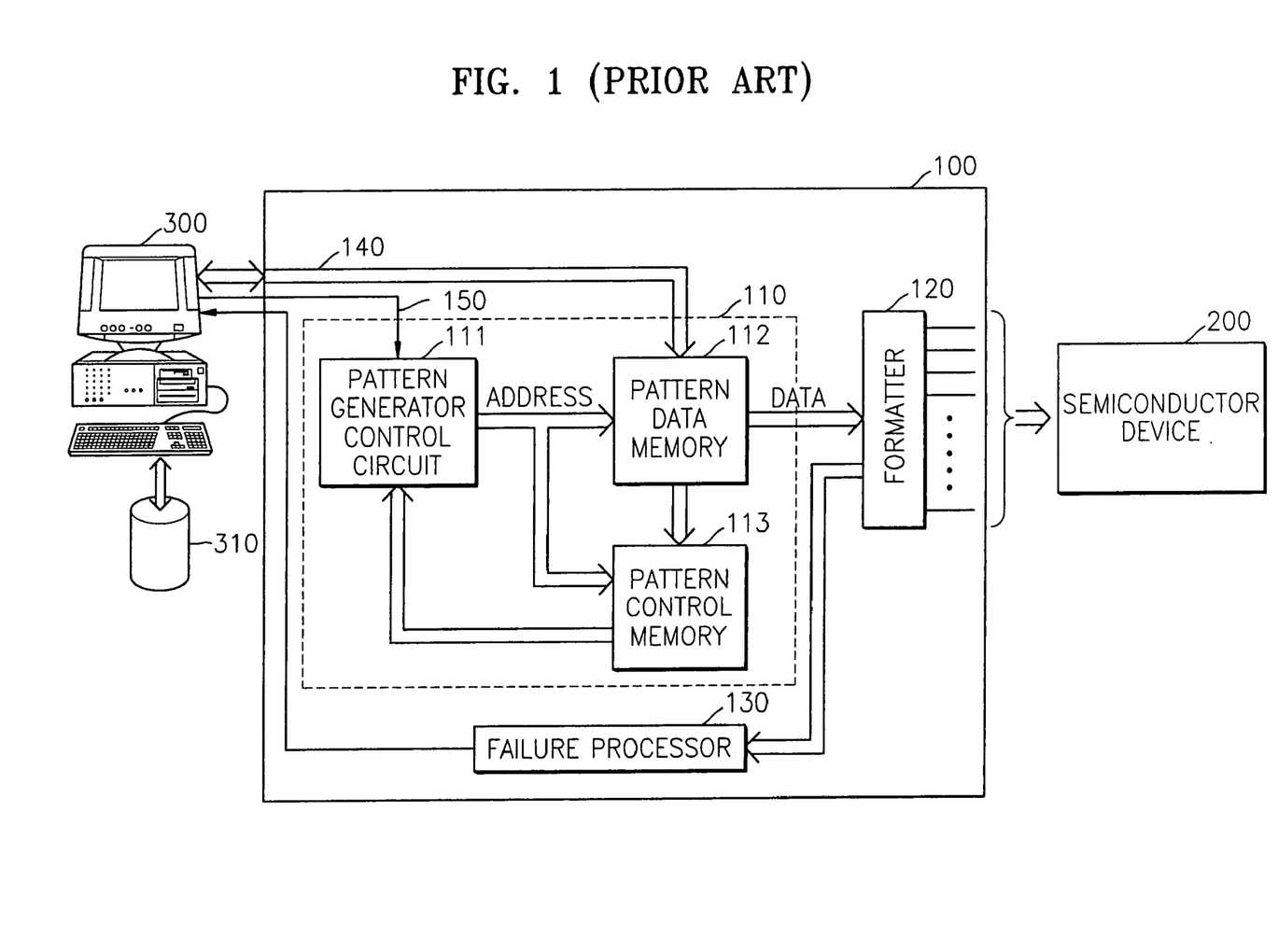
FIG. 1 is a block diagram of a semiconductor device having an output buffer circuit and an automatic test equipment according to the conventional art.

FIG. 1 is a block diagram of a semiconductor device having an output buffer circuit and ATE according to the conventional art.

Referring to FIG. 1, the semiconductor device 200 to be tested is connected to the ATE 100. The ATE 100 is controlled by a control computer 300. The control computer 300 includes a high capacity memory device, such as a disk 310, and executes a program called "pattern". The pattern includes information on stimulus signals, which are applied to the semiconductor device 200, an order in which the signals are applied, and expected responses from the semiconductor device 200. Here, the above information, with respect to any test cycle of the ATE 100, is called a vector.

The ATE 100 includes a pattern generator 110, a formatter 120, and a failure processor 130. The pattern generator 110 includes a pattern generator control circuit 111, a pattern data memory 112, and a pattern control memory 113. The pattern data memory 112 outputs to the formatter 120 data bits corresponding to an address received from the pattern generator control circuit 111. Vectors stored in the pattern data memory 112 include data bits, and vectors stored in the pattern control memory 113 include control bits.

The ATE 100 constructed in the manner described above is controlled by the control computer 300 for testing the semiconductor device 200. The pattern generator control circuit 111 generates a predetermined address signal under the control of the control computer 300. The pattern data memory 112 outputs data bits corresponding to the address signal to the formatter 120, and the formatter 120 applies the data bits to the semiconductor device 200 through a plurality of signal lines.

Figure 2:
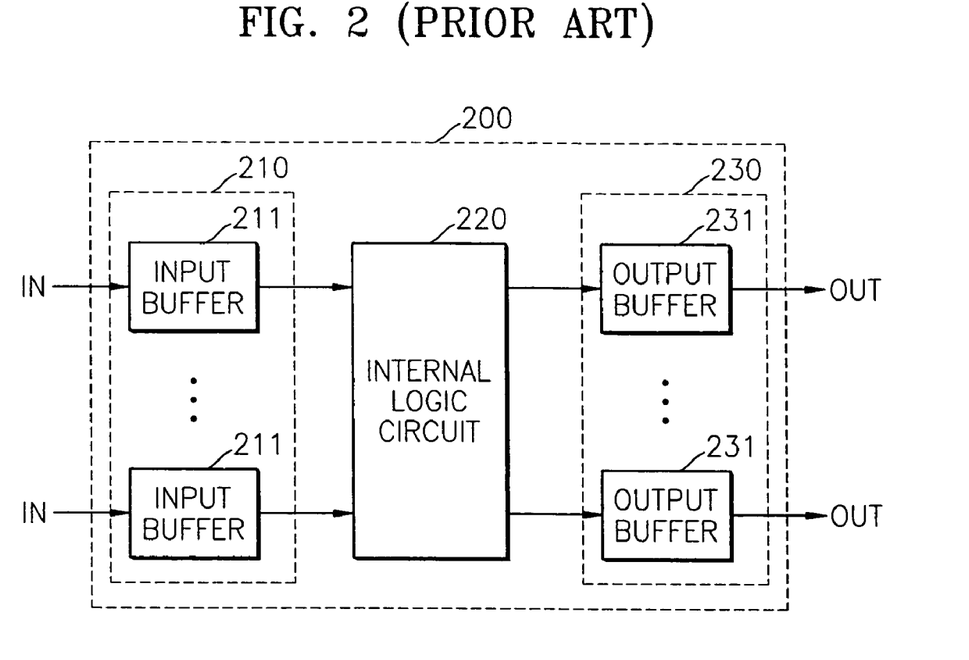
FIG. 2 is a block diagram illustrating the internal configuration of the semiconductor device in FIG. 1.

Here, referring to FIG. 2, the semiconductor device 200 receives the data bits through an input buffer circuit 210. The received data bits are transmitted to an output buffer circuit 230 through an internal logic circuit 220. The output buffer circuit 230 outputs response signals as data bits. The input buffer circuit 210 includes a plurality of input buffers 211, and the output buffer circuit 230 includes a plurality of output buffers 231.

Referring to FIG. 1 again, the formatter 120 receives the response signals output from the output buffer circuit 230 of the semiconductor device 200. The formatter 120 compares the response signals with data stored in the pattern data memory 112, and outputs comparison results to the failure processor 130. If the comparison results indicate that the response signals are not identical to the data stored in the pattern data memory, the failure processor 130 recognizes that an error exists, and transmits failure information corresponding to the error to the control computer 300.

In this manner, the characteristic of the output buffers is evaluated by the ATE.

In the evaluation of the characteristic of the output buffers, which uses the ATE, the vectors, including the data bits applied to the semiconductor device, are delayed while passing through the input buffers and the internal logic circuit. As a result, even though vectors for generating output signals VOL, which have a "low" voltage level, are inputted to the input buffers after vectors for generating output signals VOH, which have a "high" voltage level, the output buffers output signals VOH that have the previous voltage level. Therefore, the internal logic circuit in the semiconductor device affects the timing margin between output signals VOH or VOL.

Thus, the ATE applies vectors for generating output signals VOH of the output buffers to the input buffers, and then checks whether or not voltage levels of the output signals are within a predetermined range while stopping the application of vectors for generating next output signals VOL. Next, the ATE applies vectors for generating the output signals VOL of the output buffers to the input buffers, and then checks whether or not voltage levels of the output signals VOL are within a predetermined range while stopping the application of next vectors.

Furthermore, when evaluating the characteristic of the output buffers by using the ATE, the internal logic circuit in the semiconductor device affects the voltage levels of the output signals VOH or VOL of the output buffers. In further detail, for example, a case exists where an output buffer, with a condition that indicates the voltage level of an output signal VOH having a "high" voltage level should exceed 0.8V, outputs an output signal VOH having a voltage level of 0.804V or 0.805V. Due to a level decrease caused by the internal logic circuit this voltage level just satisfies the above condition. In this case, it is difficult to exactly evaluate the characteristic of the output buffer. On the other hand, semiconductor devices operating at a low voltage level, such as 1.2V, 1.0V, or 0.7V are now being developed, and the level decrease of output signals caused by the internal logic circuit becomes a serious problem in the evaluation of the characteristic of the output buffers.

As described above, since the influence of the internal logic circuit cannot be avoided during an evaluation of the characteristic of the output buffers which uses the ATE, there is an urgent need for a new test method that more precisely evaluates and analyzes the output buffers.

Accordingly, it would be desirable to provide an output buffer circuit having a signal path used for testing which can exactly evaluate the characteristic of output buffers without being affected by an internal logic circuit. It would also be desirable to provide a test method that can exactly evaluate the characteristic of output buffers without being affected by an internal logic circuit.

According to one aspect of the present invention, an output buffer circuit for outputting output signals at set logic levels in response to internal output signals received from an internal logic circuit, the output buffer circuit comprising: a first control input adapted to receive a control signal; a second control input adapted to receive a test signal having a set voltage; a test signal input circuit adapted to switch between a test mode and a normal mode in response to the control signal, to receive and output the test signal while in the test mode, and to receive and output the internal output signals while in the normal mode; and a plurality of output buffers adapted to output the output signals from the output buffer circuit through a plurality of outputs in response to one of the internal output signals and the test signal, which are output from the test signal input circuit.

According to another aspect of the present invention, a method of testing an output buffer circuit having a signal path used for testing, wherein the output buffer circuit includes a first control input, which receives a control signal; a second control input, which receives a test signal; a test signal input circuit, which switches between a test mode and a normal mode in response to the control signal, receives and outputs the test signal while in the test mode, and receives and outputs internal output signals output from an internal logic circuit while in the normal mode; and a plurality of output buffers for outputting output signals at set logic levels through a plurality of outputs in response to one of the test signal and the internal output signals, comprises: (a) connecting a control circuit, which generates the control signal and the test signal, to the first control input and the second control input, and connecting an output voltage measuring circuit to the plurality of outputs; (b) enabling the control signal, which is inputted through the first control input from the control circuit, for the purpose of switching to the test mode; (c) generating a first test signal using the control circuit and inputting the first test signal through the second control input; (d) measuring the voltage of the first output signal, among the output signals output from the plurality of outputs, using the output voltage measuring circuit; (e) generating a second test signal using the control circuit and inputting the second test signal through the second control input; and (f) measuring the voltage of the second output signal, among the output signals output from the plurality of outputs, using the output voltage measuring circuit.

According to another aspect of the present invention, an integrated circuit device, comprises an internal logic circuit adapted to provide a plurality of internal output signals; a first control input adapted to receive a control signal; a second control input adapted to receive a test signal; and an output buffer circuit, comprising: a test signal input circuit adapted to switch between a test mode and a normal mode in response to the control signal, to receive and output the test signal while in the test mode, and to receive and output the internal output signals while in the normal mode; and a plurality of output buffers, each adapted to receive and output the test signal from the test signal input circuit while in the test mode, and to receive and output a corresponding one of the internal output signals from the test signal input circuit while in the normal mode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which preferred embodiments of the invention are shown.

Figure 3:
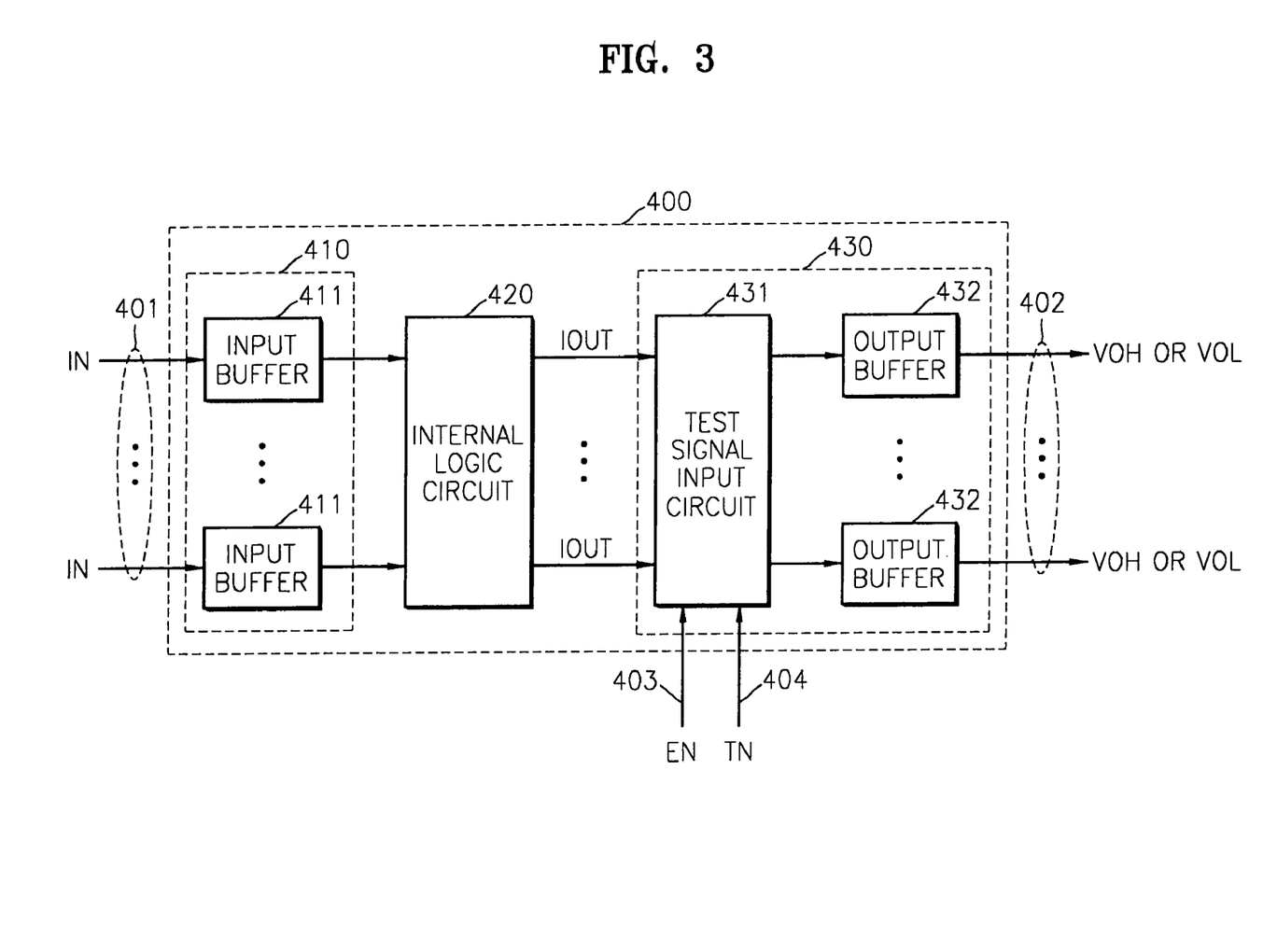
FIG. 3 is a block diagram illustrating the internal configuration of a semiconductor device having an output buffer circuit according to one or more aspects of the present invention.

FIG. 3 is a block diagram illustrating the internal configuration of a semiconductor device having an output buffer circuit.

Referring to FIG. 3, the semiconductor device 400 includes an input buffer circuit 410, an internal logic circuit 420, and an output buffer circuit 430. The input buffer circuit 410 includes a plurality of input buffers 411, and transmits input signals IN, received through inputs (e.g., input pins) 401, to the internal logic circuit 420. The internal logic circuit 420 outputs internal output signals IOUT, in response to the input signals IN.

The output buffer circuit 430 includes a test signal input circuit 431 and a plurality of output buffers 432. The test signal input circuit 431 switches between a test mode and a normal mode in response to a predetermined control signal EN, received from the outside of the output buffer circuit through a first control input (e.g., input pin) 403. In test mode, the test signal input circuit 431 outputs a predetermined test signal TN, inputted from the outside of the output buffer circuit through a second control input (e.g., input pin) 404, to the output buffers 432. In normal mode, the test signal input circuit 431 outputs the internal output signals IOUT, received from the internal logic circuit 420, to the output buffers 432.

Figure 5:
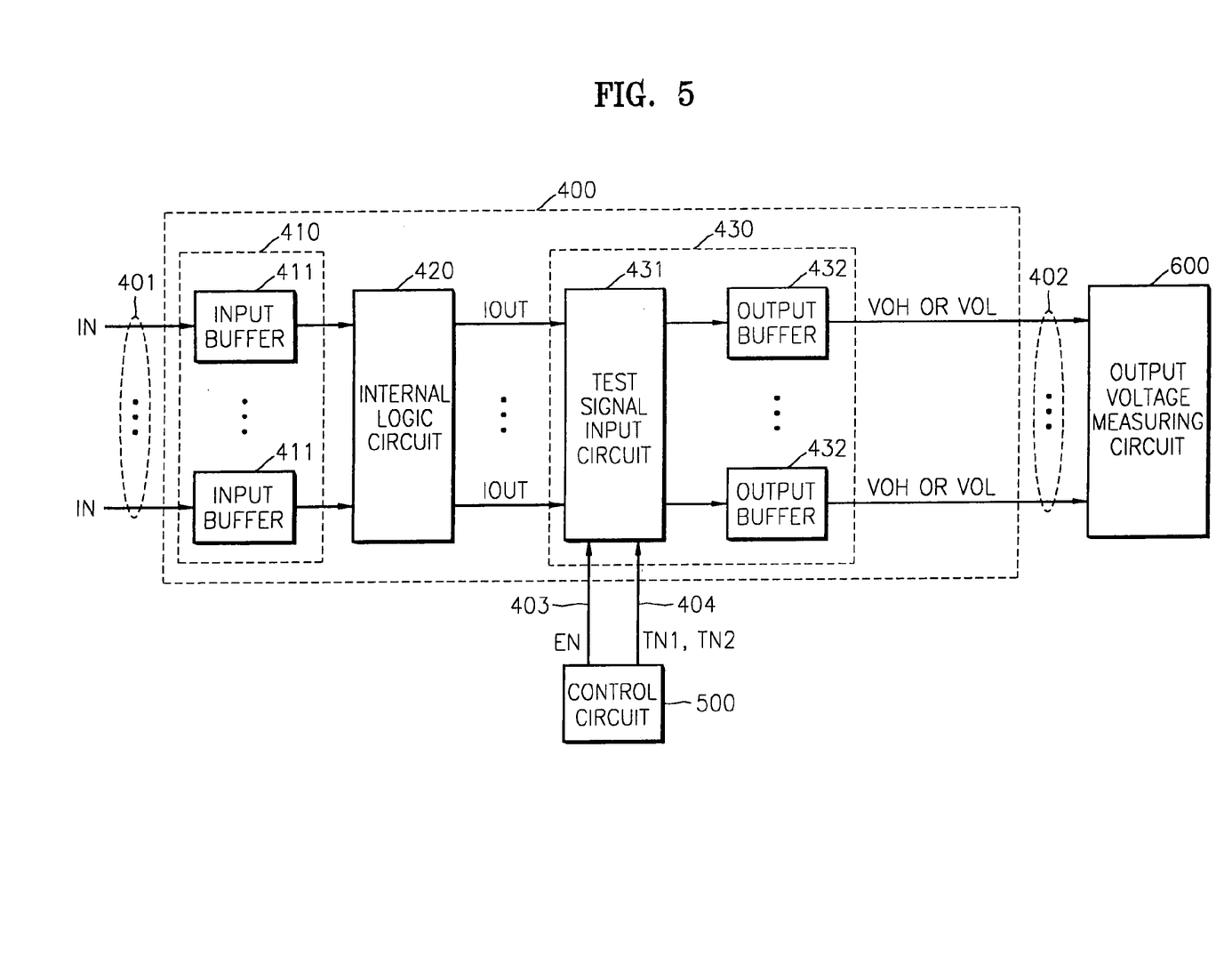
FIG. 5 is a block diagram of the semiconductor device having the output buffer circuit, a control circuit, and an output voltage measuring circuit according to one or more aspects of the present invention.

Here, the control signal EN and the test signal TN are signals generated by a separate control circuit (designated by reference numeral 500 in FIG. 5). The test signal TN has a DC voltage level that varies.

The output buffers 432 respectively respond to the internal output signals IOUT or the test signal TN, and output signals VOH having a high voltage level or signals VOL having a low voltage level to outputs (e.g., output pins) 402.

The configuration and operation of the output buffer circuit 430 described as above will be described in detail with reference to FIG. 4.

Figure 4:
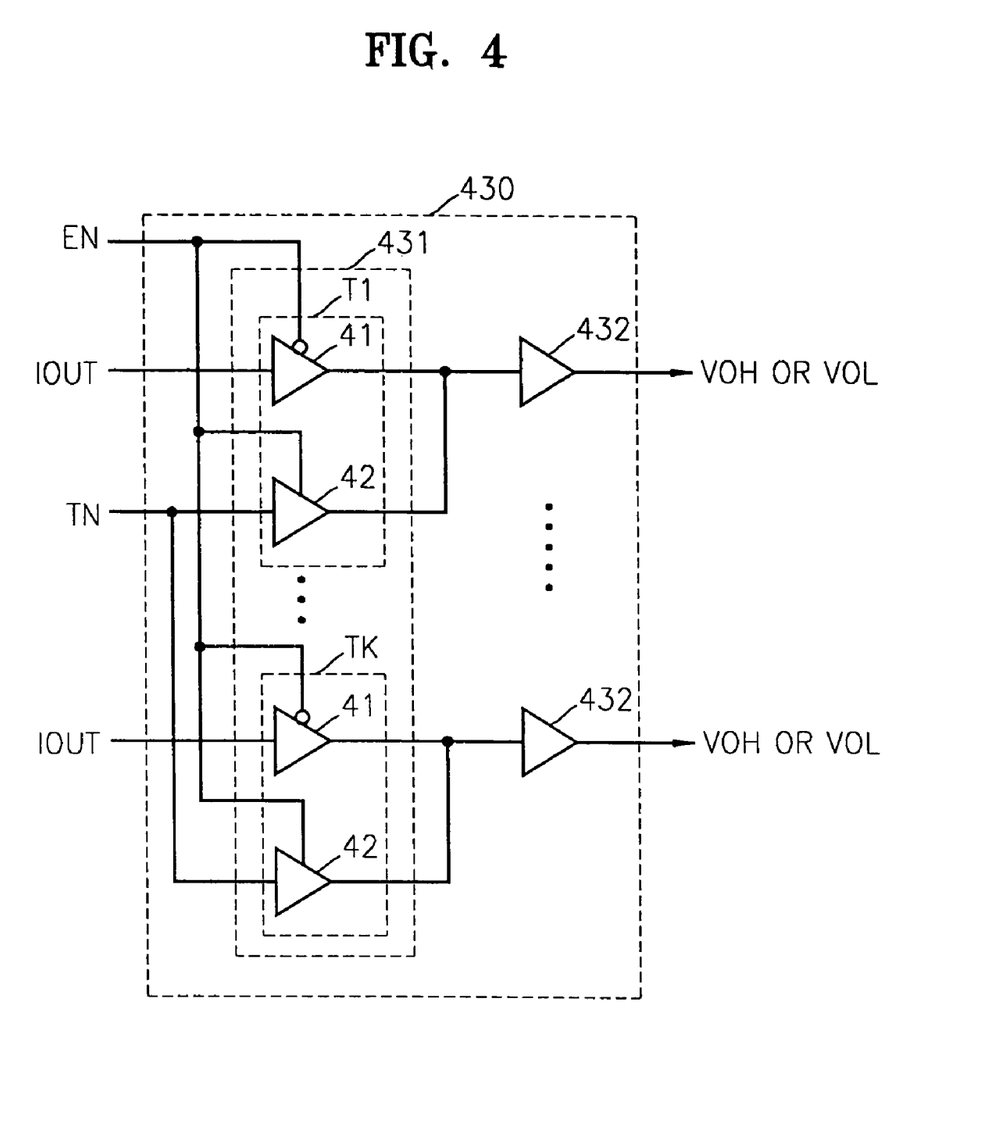
FIG. 4 is a detailed circuit diagram of the output buffer circuit according to one or more aspects of the present invention.

FIG. 4 is a detailed circuit diagram of the output buffer circuit 430.

Referring to FIG. 4, the output buffer circuit 430 includes the test signal input circuit 431 and a plurality of output buffers 432. The test signal input circuit 431 includes a plurality of input sub-circuits T1~TK (K is a natural number larger than 2) having output terminals that are connected to input terminals of the plurality of output buffers 432. Here, the test signal input circuit 431 includes the same number of input sub-circuits as the number of output buffers 432.

Each of the plurality of input sub-circuits T1~TK includes first and second buffers 41 and 42. The operation of the first buffer 41 and the second buffer 42 are controlled by the control signal EN received through the first control input (e.g., input pin) (designated by reference numeral 403 in FIG. 3). When the control signal EN is disabled, the first buffer 41 outputs internal output signals IOUT, which are output from the internal logic circuit (designated by reference numeral 420 in FIG. 3), to the output buffers 432 while the second output buffer 42 is disabled. On the other hand, when the control signal EN is enabled, the second buffer 42 outputs the test signal, TN inputted from the outside of the output buffer circuit, to the output buffers 432, and the first output buffer 41 is disabled.

As described above, an output path during normal mode is different from an output path during test mode depending on the operation of the output buffer circuit 430. That is to say, when the control signal EN is disabled in normal mode, a data output path is formed by the first buffers 41 and the output buffers 432. When the control signal EN is enabled in the test mode, an output path for a test signal is formed by the second buffers 42 and the output buffers 432.

A method of testing the output buffers constructed as above will be explained with reference to FIGS. 4 through 6.

Figure 6:
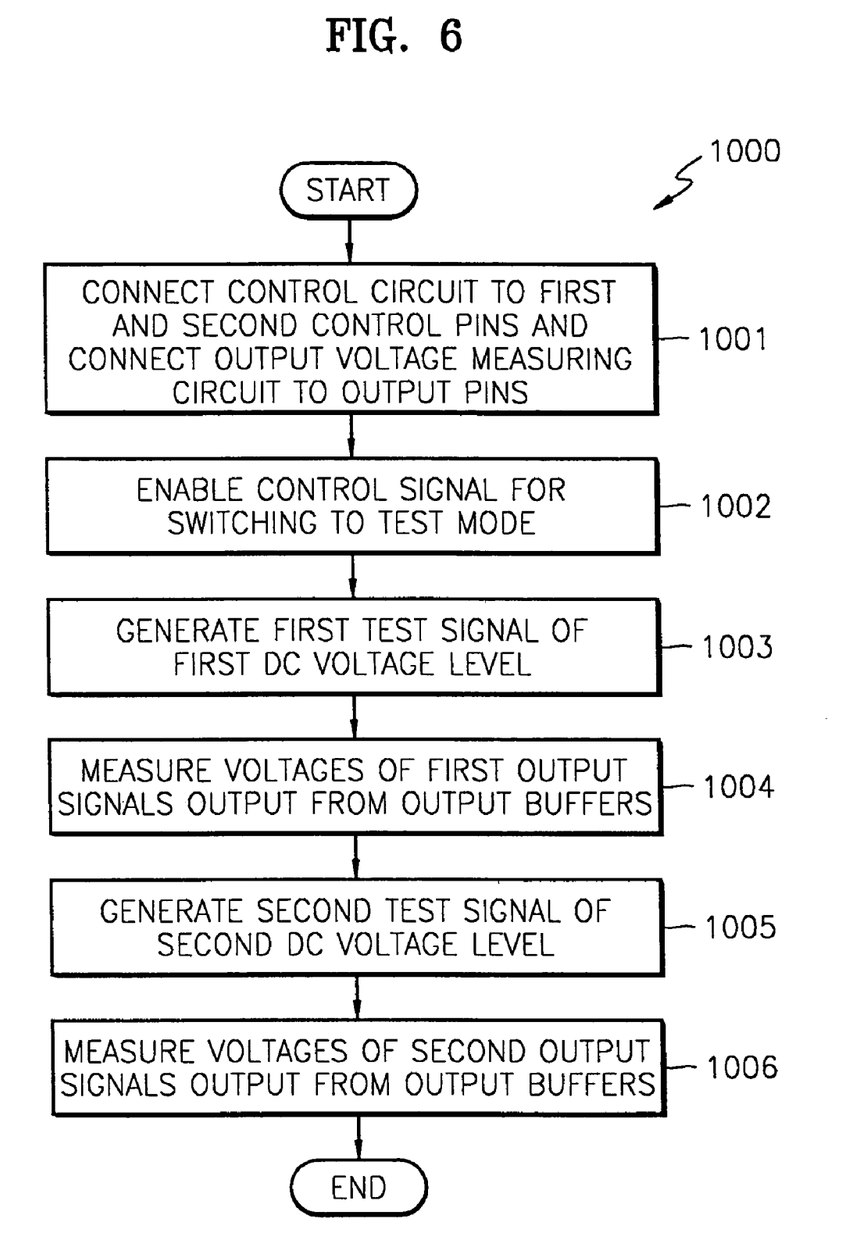
FIG. 6 is a flow chart illustrating a method of testing the semiconductor device having the output buffer circuit according to one or more aspects of the present invention.

Referring to FIG. 6, in step 1001, the control circuit 500 is connected to the first and second control inputs (e.g., input pins) 403 and 404 of the output buffer circuit 430, and the output voltage measuring circuit 600 is connected to the outputs (e.g., output pins) 402 as shown in FIG. 5. Here, the control circuit 500 can be realized through various forms and modifications as long as it can generate a control signal EN and a test signal TN having a DC voltage level. Furthermore, the output voltage measuring circuit 600 can be realized in various forms and modifications as long as it can measure a DC voltage.

In step 1002, the control circuit 500 enables the control signal EN for the purpose of switching to test mode. The second buffers 42 of the plurality of input sub-circuits T1~TK of the test signal input circuit 431 are respectively activated in response to the control signal EN. As a result, an output path for a test signal is formed by the second buffers 42 and the output buffers 432.

Next, in step 1003, the control circuit 500 generates a first test signal TN1 of a first DC voltage level. The second buffers 42 of the test signal input circuit 431 receive the first test signal TN1 through the second control input (e.g., input pin) 404, and output the received first test signal TN1 to the output buffers 432. Here, since the first buffers 41 of the test signal input circuit 431 are disabled, the corresponding output path originating from the internal logic circuit 420 is disabled.

The output buffers 432 output first output signals VOH, having a "high" voltage level, to the outputs (e.g., output pins) 402 in response to the first test signal TN1. In step 1004, the output voltage measuring circuit 600 measures the voltages of the first output signals VOH.

Next, in step 1005, the control circuit 500 generates a second test signal TN2 of a second DC voltage level. The second buffers 42 receive the second test signal TN2 through the second control input (e.g., pin) 404, and output the received second test signal TN2 to the output buffers 432. The output buffers 432 output second output signals VOL, having a "low" voltage level, to the outputs (e.g., output pins) 402 in response to the second test signal TN2. Next, in step 1006, the output voltage measuring circuit 600 measures the voltages of the second output signals VOL.

Here, the DC voltage levels of the first test signal TN1 and the second test signal TN2 can vary depending on the current drive capability of the output buffers. This is because even though the output buffers have different current drive capability and output the same output signals VOH, having a "high" voltage level, the voltage levels of the output signals VOH are different from each other. Therefore, the DC voltage levels of the first and second test signals TN1 and TN2 also need to be changed according to the current drive capability of the output buffers.

As previously mentioned, the output buffer circuit can exactly and easily evaluate the characteristic of the output buffers by directly applying a test signal of a DC voltage level to the output buffer circuit, without using the internal logic circuit, and then measuring the voltage levels of the output signals thereof.

As described above, the test signal of a DC voltage level, corresponding to the current drive capability of the output buffers, is directly applied to the output buffers through the signal path used for testing, and accordingly the characteristics of the output buffers can be exactly evaluated without being affected by the internal logic circuit.

Furthermore, the output signals of the output buffers are tested using the test signal of the DC voltage level without running vectors, and accordingly the analysis and evaluation of the characteristic of the output buffers can be easily conducted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output buffer circuit for outputting output signals at set logic levels in response to internal output signals received from an internal logic circuit, the output buffer circuit comprising:
   a first control input adapted to receive a control signal;
   a second control input adapted to receive a test signal having a set voltage;
   a test signal input circuit adapted to switch between a test mode and a normal mode in response to the control signal, to receive and output the test signal while in the test mode, and to receive and output the internal output signals while in the normal mode; and a plurality of output buffers adapted to output the output signals from the output buffer circuit through a plurality of outputs in response to one of the internal output signals and the test signal, which are output from the test signal input circuit, wherein a DC voltage level of the test signal varies according to a current drive capability of the plurality of output buffers.

2. The output buffer circuit of claim 1, wherein the test signal input circuit includes a plurality of input sub-circuits having output terminals connected to input terminals of the plurality of output buffers, and each input sub-circuit forms an output path for the test signal when the control signal is enabled and forms an output path for a corresponding one of the internal output signals when the control signal is disabled.

3. The output buffer circuit of claim 2, wherein each of the input sub-circuits includes:

a first buffer, which is activated when the control signal is disabled, and which is adapted to receive and output the corresponding internal output signal; and a second buffer, which is activated when the control signal is enabled, and which is adapted to receive and output the test signal.

4. A semiconductor device comprising the output buffer circuit of claim 1.

5. A method of testing an output buffer circuit having a signal path used for testing, wherein the output buffer circuit includes a first control input, which receives a control signal; a second control input, which receives a test signal; a test signal input circuit, which switches between a test mode and a normal mode in response to the control signal, receives and outputs the test signal while in the test mode, and receives and outputs internal output signals output from an internal logic circuit while in the normal mode; and a plurality of output buffers for outputting output signals at set logic levels through a plurality of outputs in response to one of the test signal and the internal output signals, the method comprising:

(a) connecting a control circuit, which generates the control signal and the test signal, to the first control input and the second control input, and connecting an output voltage measuring circuit to the plurality of outputs;

(b) enabling the control signal, which is inputted through the first control input from the control circuit, for the purpose of switching to the test mode;

(c) generating a first test signal using the control circuit and inputting the first test signal through the second control input;

(d) measuring the voltage of the first output signal, among the output signals output from the plurality of outputs, using the output voltage measuring circuit;

(e) generating a second test signal using the control circuit and inputting the second test signal through the second control input; and (f) measuring the voltage of the second output signal, among the output signals output from the plurality of outputs, using the output voltage measuring circuit.

6. The method of claim 5, wherein a DC voltage level of the first test signal is different from a DC voltage level of the second test signal, and the DC voltage levels of the first and second test signals vary according to a current drive capability of the plurality of output buffers.

7. An integrated circuit device, comprising:

an internal logic circuit adapted to provide a plurality of internal output signals;

a first control input adapted to receive a control signal;

a second control input adapted to receive a test signal; and an output buffer circuit, comprising:

a test signal input circuit adapted to switch between a test mode and a normal mode in response to the control signal to receive and output the test signal while in the test mode, and to receive and output the internal output signals while in the normal mode; and a plurality of output buffers, each adapted to receive and output the test signal from the test signal input circuit while in the test mode, and to receive and output a corresponding one of the internal output signals from the test signal input circuit while in the normal mode, wherein a DC voltage level of the test signal varies according to a current drive capability of the plurality of output buffers.

8. The output buffer circuit of claim 7, wherein the test signal input circuit includes a plurality of input sub-circuits having output terminals connected to input terminals of the plurality of output buffers, and each input sub-circuit forms an output path for the test signal when the control signal is enabled and forms an output path for a corresponding one of the internal output signals when the control signal is disabled.

9. The output buffer circuit of claim 8, wherein each of the input sub-circuits includes:

a first buffer, which is activated when the control signal is disabled, and which is adapted to receive and output the corresponding internal output signal; and a second buffer, which is activated when the control signal is enabled, and which is adapted to receive and output the test signal.

* * * * *